United States Patent [19]

Walters

[11] Patent Number: 4,709,253

[45] Date of Patent: Nov. 24, 1987

[54] SURFACE MOUNTABLE DIODE

[75] Inventor: Cecil K. Walters, Scottsdale, Ariz.

[73] Assignee: AMP Incorporated, Harrisburg, Pa.

[21] Appl. No.: 859,126

[22] Filed: May 2, 1986

[51] Int. Cl.$^4$ ............................................. H01L 23/48
[52] U.S. Cl. ........................................ 357/68; 357/65; 357/13; 361/400
[58] Field of Search ............................ 357/65, 68, 13; 361/400, 402, 405

[56] References Cited

U.S. PATENT DOCUMENTS

| | | | |
|---|---|---|---|
| 3,300,710 | 1/1967 | Knauss | 323/231 |
| 3,736,475 | 5/1973 | Berner | 357/72 |
| 3,886,581 | 5/1975 | Katsumura et al. | 357/17 |
| 4,075,649 | 2/1978 | Verderber | 357/13 |
| 4,126,496 | 11/1978 | Verderber | 148/187 |
| 4,136,349 | 1/1979 | Tsang | 357/13 |
| 4,136,351 | 1/1979 | Sugawara et al. | 357/19 |
| 4,213,806 | 7/1980 | Tsang | 148/187 |
| 4,319,257 | 3/1982 | Beasom | 357/13 |
| 4,339,785 | 7/1982 | Ohsawa | 361/400 |
| 4,349,394 | 9/1982 | Wei | 148/175 |
| 4,412,376 | 11/1983 | DeBar et al. | 29/576 |
| 4,450,021 | 5/1984 | Batra et al. | 29/571 |
| 4,473,941 | 10/1984 | Turi et al. | 29/578 |
| 4,516,223 | 5/1985 | Erickson | 365/175 |
| 4,525,922 | 7/1985 | Kiriseko | 29/577 |

FOREIGN PATENT DOCUMENTS 466427 1/1969 Switzerland.

Primary Examiner—Martin H. Edlow
Assistant Examiner—Mark Prenty
Attorney, Agent, or Firm—Katherine A. Nelson

[57] ABSTRACT

A surface mountable bipolar zener diode includes first and second semiconductor elements, each of which defines a respective p-n junction near a respective inner face, and each of which defines a respective metallized layer on a respective outer face. The inner faces are soldered together such that the p-n junctions are disposed near the center of the assembled diode. The outer faces are operated parallel to one another and to the p-n junctions and are disposed perpendicularly to a pair of printed circuit board contacts. Fillets of solder or conductive epoxy extend between the metallized layers and the printed circuit board contacts to interconnect the bipolar zener diode with the printed circuit board contacts.

26 Claims, 5 Drawing Figures

SURFACE MOUNTABLE DIODE

BACKGROUND OF THE INVENTION

This invention relates to surface mountable diodes which can readily be surface mounted in a minimum of space and with a minimum of complexity.

Diodes are in widespread use as transient suppression devices, rectifiers, light sources, light detectors, and voltage references. In many applications it is important to be able to surface mount a diode directly to a surface such as a circuit board without wire leads or the like. In particular, when bipolar or unipolar zener diodes are used as transient suppression devices, high mounting density is often of key importance.

The present invention is directed to improved diodes which do not require wire leads and which can readily be made in extremely small sizes to minimize mounting space requirements.

SUMMARY OF THE INVENTION

According to one aspect of this invention, a surface mounted diode comprises a semiconductor element which defines a base and first and second opposed faces extending away from the base. This semiconductor element comprises a p-n junction electrically interconnected between the opposed faces and spaced from the base. A first conductive layer is secured to the first opposed face, and means are provided for electrically interconnecting the second opposed face with a second conductive layer arranged generally parallel to the first conductive layer such that the p-n junction is interposed between the two conductive layers. Each of the conductive layers defines a respective exposed surface and the base is oriented parallel to a mounting plane defined by a mounting surface such that each of the exposed surfaces of the conductive layers is in contact with a respective spaced contact of the mounting surface, and the exposed surfaces of the conductive layers extend away from the mounting plane. Two masses of a conductive securing agent, such as a suitable solder or conductive epoxy, are each secured both to a respective one of the contacts and the exposed surface of the associated conductive layers to form fillets. The securing agent is selected to move onto the exposed surfaces by capillary action when in a fluid state.

Preferably, the exposed surfaces of the conductive layers extend transverse both to the base of the semiconductive element and to the contacts of the mounting surface. The diode can, for example, be either a unipolar or a bipolar zener diode for use as a transient suppression device. By attaching the securing agent directly to the exposed surfaces of the conductive layers which extend away from the base and contacts, the size, cost and complexity of the diode are all held to a minimum. Furthermore, the sensitive p-n junction is separated from the securing agent, thereby minimizing damage to the p-n junction. In the preferred embodiment described below, the semiconductor element defines three or more bases which are symmetrically situated around the perimeter of the semiconductor element such that any one of a number of orientations of the diode can be used without interfering with the function of the diode. This simplifies mounting operations considerably and reduces manufacturing problems related to misoriented diodes.

According to a second feature of this invention, a surface mountable bipolar diode is provided which comprises a first semiconductor element which defines a first outer face, a first inner face, and means for forming a first p-n junction therebetween. In addition, a second semiconductor element is provided which defines a second outer face, a second inner face, and means for forming a second p-n junction therebetween. First means electrically interconnect and mechanically secure the first and second faces together between the outer faces in order to form an integrated unit which defines a base extending between the outer faces, wherein the first and second p-n junctions are oriented with reverse polarity. First and second conductive surfaces are mounted on the first and second outer faces such that the first and second p-n junctions are positioned between the first and second conductive surfaces and the conductive surfaces extend away from the base. The conductive surfaces are positioned for surface mounting to respective mounting urfaces extending alongside the base. Preferably, the conductive surfaces are oriented parallel to each other and substantially transverse to the base. In the preferred embodiment described below, the conductive surfaces comprise respective metallized layers.

The bipolar diode of this invention can, for example, be formed as a bipolar zener diode for use as a transient suppression device. The bipolar diode of this invention provides important advantages in that both p-n junctions are located near the center of the device, and are therefore well protected. Preferably, the p-n junctions are centered on the respective inner faces and the entire bipolar diode is symmetrical such that it can be flipped end-for-end and rotated about an axis extending between the conductive surfaces without altering the electrical function of the diode. When this approach is used misorientation of the diode on a circuit board is practically eliminated.

The invention itself, together with further objects and attendant advantages, will best be understood by reference to the following detailed description, taken in conjunction with the accompanying drawings.

DETAILED DESCRIPTION OF THE PRESENTLY PREFERRED EMBODIMENTS

Figure 1:
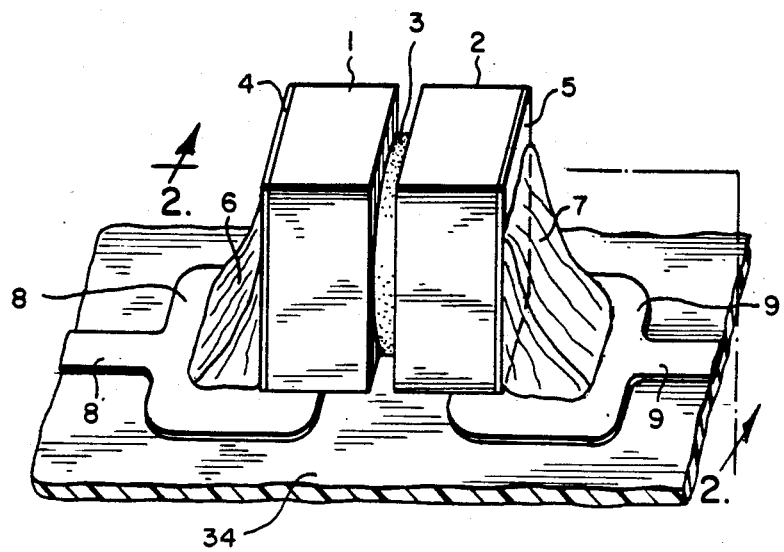
FIG. 1 is a perspective view of a bipolar diode which incorporates a first presently preferred embodiment of this invention, mounted to a circuit board.
Figure 2:
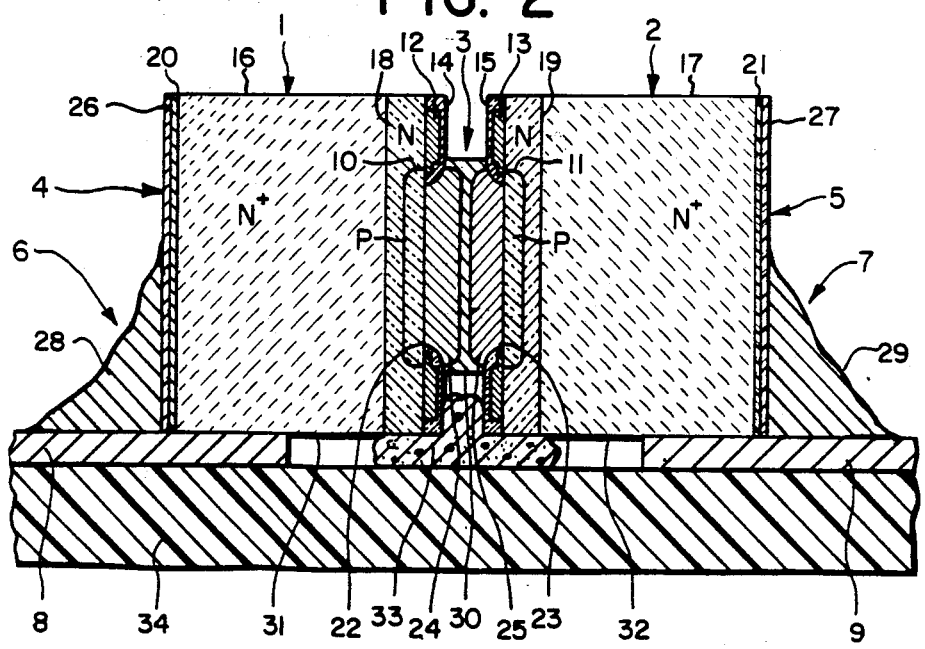
FIG. 2 is a longitudinal section taken along the centerline of the diode of FIG. 1.

Turning now to the drawings, FIGS. 1 and 2 show two views of a bipolar zener diode which incorporates a first presently preferred embodiment of this invention. This diode includes first and second semiconductor elements or dies 1,2, each of which defines a respective p-n junction as described in greater detail below. The two semiconductor elements 1,2 are bonded together in a bonding region 3 adjacent to the p-n junctions. Each of the semiconductor elements 1,2 defines a respective outer face 4,5 and at least one respective base 31,32. As shown in the drawings, the outer faces 4,5 are preferably oriented parallel to one another and transverse to the bases 31,32.

The manner in which the diode is mounted in place to a circuit board will be described in greater detail below. Briefly stated, each of the outer faces 4,5 defines a respective metallized layer, and these metallized layers are positioned to contact and extend transversely away from respective printed circuit contacts 8,9. Bonding joints 6,7 formed of a material, such as an appropriate solder or conductive epoxy, electrically and mechanically interconnect the outer faces 4,5 with the respective printed circuit board contacts 8,9.

Thus, the diode of FIGS. 1 and 2 is electrically interconnected to the printed circuit board contacts in an economical manner without the use of wire bonds, clips, or other conventional lead attachments. Furthermore, unnecessary packaging elements have been eliminated, and it is the passivated semiconductor elements themselves which are used to connect the diode with the printed circuit board contacts, 8,9.

FIG. 2 is a cross-section illustrating in detail the various component elements of the bipolar zener diode of FIG. 1. This diode operates bidirectionally to conduct signals above a predetermined voltage threshold in either direction. If one of the printed circuit board contacts 8 is connected to a signal source such as a pin of a connector, and the other contact 8,9 is connected to ground, the bidirectional zener diode of FIGS. 1 and 2 is well suited for use as a transient suppression device which can be made extremely compact in size. As pointed out below, this invention is not limited to use with bipolar devices, but can readily be adapted to unipolar diodes.

As shown in FIGS. 1 and 2, the illustrated diode is formed of two semiconductor elements 1,2. Each of the semiconductor elements 1,2 is formed of a semiconductor material such as silicon, and each defines a respective p-n junction 10,11 oriented generally parallel to the outer face 4,5 of the semiconductor element 1,2. These p-n junctions are passivated with thermal oxide $SiO_2$ in regions 12,13, and the passivated regions are covered with a fritted borosilicate glass in regions 14,15 to assure adequate protection to the p-n junction 10,11 in the environment in which the diode will be used.

In this embodiment the semiconductor elements 1,2 are identical and they can be fabricated in a conventional planar wafer manufacturing process. This process starts with a wafer which will be processed to form a large number of the semiconductor elements 1,2. After the various process steps have been completed, the wafer is cut or diced into the separate semiconductor elements 1,2. Because the diode is mounted on its side in final assembly to the printed circuit board, it is advantageous to use a relatively thick wafer in the fabrication process, which wafer is preferably formed of a low resistivity semiconductor substrate. In FIG. 2, this substrate is identified by the reference numerals 16 and 17 as an n+ region, which in this embodiment preferably has a resistivity of about 0.01 ohm-cm. By using a low resistivity, highly doped substrate, parasitic resistance is held to a minimum, thereby reducing the dynamic impedance of the resulting zener diode. Of course, it should be understood that diodes in accordance with this invention can also be formed with the reverse dopant species from those shown in FIG. 2, i.e., p+ substrates can be used in conjunction with n type diffused n-p junctions.

The first step in the fabrication of the semiconductor element 1,2 is to form an epitaxial deposition layer 18,19 of a resistivity value which will help control the desired zener or avalanche voltage value desired. In the case of a 20 volt avalanche breakdown device, the epitaxial layer 18,19 preferably has a resistivity of approximately 0.03 ohm-cm, and is approximately 24 microns in thickness. The wafer is then thermally oxidized to form a layer of $SiO_2$ which in this embodiment has a thickness of about 1 micron. A first photolithography step is then performed to etch open a diffusion window. A suitable dopant (such as boron in this example) is then predeposited on the diffusion window and a diffusion drive-in step is then performed to drive the p-n junction to a depth of approximately 8 microns in this embodiment. Such a p-n junction has been found suitable for a 20 volt avalanche breakdown diode. The p layer formed in the drive-in step preferably has a sheet resistance of about 22 ohms per square.

The next step in the fabrication process is to backgrind the wafer to obtain the desired final thickness for the semiconductor elements 1,2. Then a surface enhancement diffusion or phosphorus getter operation is performed to form a very highly doped region n++ 20,21 having a sheet resistance of about 2 ohms per square. This very highly doped region 20,21 provides a good ohmic backside contact as explained below. Such an enhancement operation can also be provided by other low temperature doping techniques with selected doped metallizations as part of the backside metallization operation near the end of the overall wafer process.

After the surface enhancement operation, the wafer is again selectively etched via a photolithography step to provide an ohmic contact window through the thermal oxide which was grown during the diffusion step. The wafer may then be further passivated with an additional layer of borosilicate glass as shown in regions 14 and 15 in FIG. 2. If such a glass layer is deposited, then a third selective etch operation is required to provide the final ohmic contact window opening. A layer of palladium is deposited via thin film evaporation techniques in this ohmic contact window opening, in the region 22,23. This thin film of palladium is then sintered to the exposed silicon in the regions 22,23. Excess palladium is removed from the glass 14,15 by chemical etching. Thereafter, a relatively thick silver bump contact 24,25 is galvanically deposited over the palladium. Typically, each bump contact 24,25, is approximately 0.001 inch in thickness.

Finally, a backside metallization layer 26,27 is deposited over the enhanced layer 20,21. This metallization layer 26,27 is selected to provide for suitable solder flow or other conductive bonding material flow to these surfaces to ensure the formation of adequate fillets 28,29 extending between the printed circuit board contacts 8,9 and the metallization layers 26,27. The metallization layers 26,27 can be formed of electroless nickel and gold depositions, or by evaporated layers of chrome followed by silver followed by gold. In addition, other metallization layers including solder coatings can be used. It is often important that the relative metal thickness of the layer 26,27 be selected to promote solder wetting without total dissolution of available metals or eventual dewetting of the metallization layer 26,27. In this way good bond integrity between the metallization layers 26,27 and the printed circuit board contacts 8,9 can be obtained, even when the metallization layers 26,27 are oriented approximately perpendicularly with respect to the printed circuit board contacts 8,9. One presently preferred embodiment for the metallization layers 26,27 includes the following layers, starting adjacent to the n++ layer 20,21:

(1) a 700 Angstrom layer of chrome;
(2) a 2000 Angstrom layer of a chrome-silver mixture (approximately 1:8 by volume with silver constituting the major portion);
(3) a 2900 Angstrom silver layer; and
(4) a 1800 Angstrom gold layer.

The chrome layer bonds well to silicon, the silver layer dissolves well in solder, and the gold layer protects the silver layer from oxidation.

Figure 3:
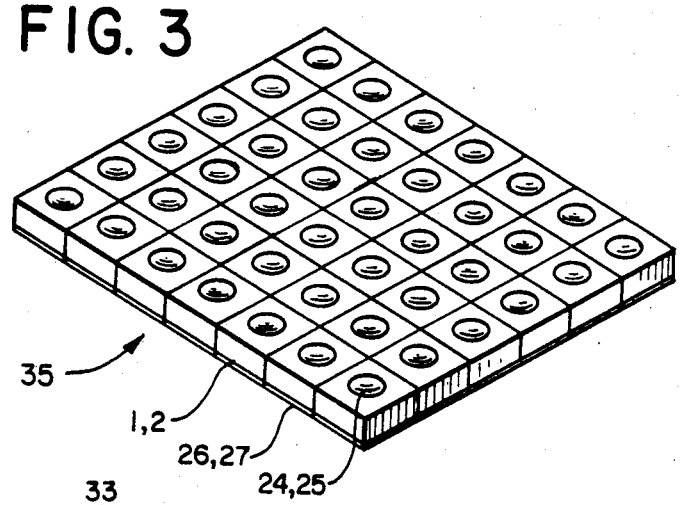
FIG. 3 is a perspective view of a wafer showing components of the diode of FIG. 1 in an intermediate stage of manufacture.
Figure 4:
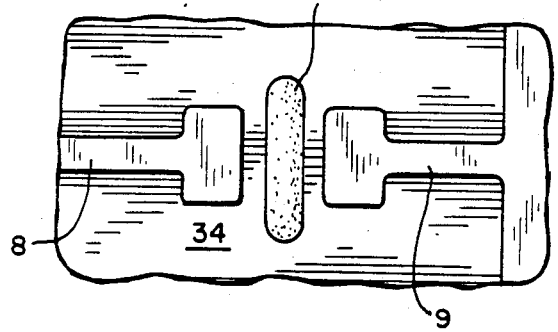
FIG. 4 is a plan view of the circuit board of FIG. 1 prior to mounting the diode.

FIG. 3 shows a portion of the wafer 35 at the completion of the wafer fabrication process. At this stage, the wafer is then sawed or otherwise cut into individual dies or semiconductor elements 1,2. These individual semiconductor elements may be shaped as desired, and configuration such as squares, rectangles, triangles, pentagons, and hexagons, are all suitable. Regardless of the configuration chosen, each semiconductor element 1,2 should define at least one base 31,32 which is reasonably planar to allow the finally assembled diode to rest on the base 31,32.

After the wafer has been cut into individual semiconductor elements 1,2, the bipolar diode is assembled by soldering or affixing with conductive epoxy two of the semiconductor elements 1,2 together with a central bond 30. In this embodiment the central bond 30 is a solder of 95% lead and 5% tin which has a melting point of about 315° C. Preferably a disc of the solder is clamped in place between the contacts 24,25, and the assembly is heated to create the desired bond. The solder should be chosen to have a higher melting point than any solder used to mount the diode in place.

The two semiconductor elements 1,2 are rotationally aligned one with the other with the planar p-n junctions 10,11 facing one another. The metallization layers 26,27 are oriented parallel to one another and to the p-n junctions 10,11 and perpendicular to the base 31,32. With this geometry, the bipolar diode can be mounted with the bases 31,32 resting on the respective printed circuit board contacts 8,9 and the sensitive p-n junctions 10,11 situated approximately midway between the printed circuit board contacts 8,9. In this way, the p-n junctions 10,11 are isolated and protected.

The diode of FIGS. 1 and 2 can be formed in a wide range of sizes and with a wide range of electrical characteristics. The following information is provided merely to define one preferred embodiment in greater detail and is of course not intended to be in any way limiting:

| | |
|---|---|
| A. Dimensions of outer face 4,5: | 0.0360 inch by 0.0360 inch; |
| B. Distance between outer faces 4,5: | 0.045 inch; |
| C. Distance between regions 22,23: | 0.003 inch; |
| D. Breakdown Voltage: | 20 V; |
| E. Test Current: | 1 mA; |
| F. Working Peak Voltage: | 15 V; |
| G. Leakage Current at Working Peak Voltage: | 10 μA; |
| H. Maximum Peak Surge Voltage: | 40 V; |
| I. Maximum Peak Surge Current: | 20 A; |
| J. Maximum Capacitance: | 300 pf; |
| K. Peak Surge Energy Dissipation: | 0.005 Joules (10 μ sec), 0.05 Joules (1 m sec). |

The bipolar zener diode of FIGS. 1 and 2 is mounted to a printed circuit board with fillets 28,29 of a material such as solder or epoxy which electrically interconnects the metallization layers 26,27 with respective contacts 8,9 of the printed circuit board. One approach to this mounting operation which has been found suitable is described below.

First, a printed circuit board 34 is cleaned and dried in an oven for about 1 hour at 100 deg. C., and a suitable epoxy 33 is then applied to the printed circuit board between the contacts 8,9. This epoxy 33 is of the type which provides a high electrical resistance after curing. The material marketed by Ablestick Co. of Gardenia, Calif. as Ablebond 77-2LTC has been found suitable for use as the epoxy 33. The assembled diode is then placed on the printed circuit board as shown in FIG. 2 such that the central solder bond 30 is centered over the insulating epoxy 33 and each of the metallization layers 26,27 is in electrical contact with a respective one of the contacts 8,9. The printed circuit board with the mounted diode is then placed in an oven to cure the insulating epoxy 33. After curing of the insulating epoxy 33 a solder paste is applied to each of the metallization layers 26,27. Solder of the type marketed as Alpha brand 60/40 solder with Alpha brand 611 flux (RMA) has been found suitable. The solder paste is then cured at a temperature of 80 deg. C. for 15 minutes in a suitable oven and then a reflow operation is performed in an infrared oven or a vapor phase soldering machine to form the fillets 28,29 interconnecting the metallization layers 26,27 with the respective contacts 8,9. The solder reflow operation should not subject the central solder bond 30 to elevated temperatures which might weaken the bond. After the solder reflow operation, the printed circuit board is cleaned and tested and a sealing epoxy may optionally be applied to the top of the diode to flow around the central solder bond 30. This sealing epoxy is cured at 150 deg. C. for 1 hour and the printed circuit board is again electrically tested. The nonconductive epoxy described above may be used as the sealing epoxy.

In some applications, it may be preferable to substitute a conductive epoxy for the 60/40 solder paste described above. In this event, the solder reflow operation described above is eliminated and replaced with an oven curing operation suitable for the conductive epoxy used. A suitable conductive epoxy is marketed by Ablestick Co. as Ablebond 84-1LMIT.

One important advantage of the geometry described above is that the bipolar zener diode can be mounted with any of the sides which extend between the metallization layers 26,27 serving as the base 31,32. Thus, careful rotational positioning of the diode is not required. Furthermore, the diode can be turned end-for-end without adversely affecting its electrical performance. In all of these positions, the bonding region 3 is disposed above and away from the printed circuit board contacts 8,9, thereby reducing the possibility of undesired contact between the solder or conductive epoxy of the fillets 28,29 and the p-n junctions 10,11.

Of course, many variations can be made to the bipolar zener diode described above. For example, metal pads of desired thickness may be placed on the metallization layers 26,27 to provide heat sinks and increased bonding surface area to the printed circuit board contacts 8,9. Furthermore, if desired a protective coating in the bonding region 3 can be provided. Such a protective coating may be desirable in specific mounting environments and can be provided, for example, by use of a semiconductor grade varnish, epoxy or polyimide material which can be flowed into the bonding region 3 between the semiconductor elements 1,2 and then dried at elevated temperatures. Furthermore, as pointed out above, the dopant species may be reversed by starting with a p+ substrate and then doping with a suitable n dopant to form a p-n junction.

Figure 5:
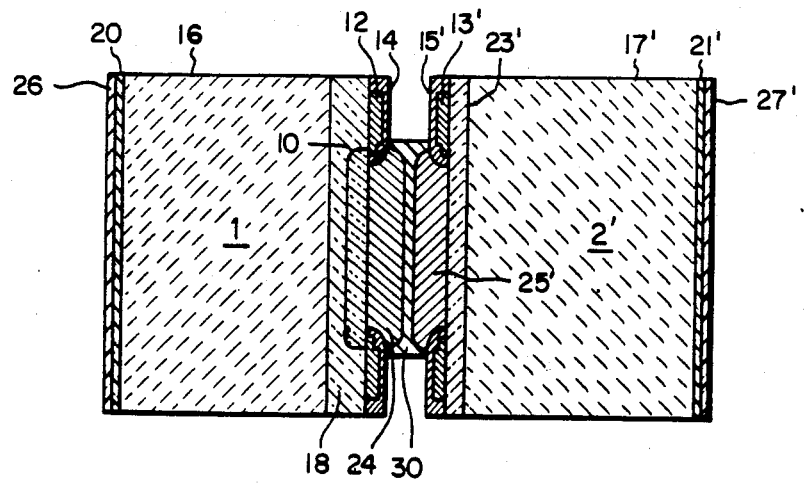
FIG. 5 is a section of a unipolar diode which incorporates a second preferred embodiment of this invention.

In addition, this invention can be used to form unipolar diodes. As shown in FIG. 5, this can be done simply by eliminating the p-n junction from the semiconductor element 2 to form a simplified semiconductor element 2'. This simplified semiconductor element 2' is quite similar to the semiconductor element 2 except that an n++ enhanced surface is provided in the region 23, and the epitaxial region 19 is not required. This simplified semiconductor element 2' simply provides a short circuit path from the p-n junction of the semiconductor element 1 to the printed circuit board contact 9. In this way, a unipolar or single p-n junction path between the two circuit board contacts 8,9 is provided. Of course, this unipolar diode can also be fabricated with dopant species which are the reverse of those described above, as can the simplified semiconductor element 2'.

In alternate embodiments, the simplified semiconductor element 2' may be replaced with a block metal conductor having a similarly shaped geometry. If the solder bonding and the conductivity properties of this metal block are chosen properly, the same mounting techniques as those described above can be used.

From the foregoing, it should be apparent that unipolar and bipolar diodes have been described which allow a remarkably simple, effective and compact surface mounting technique. This invention can be adapted for use with a wide variety of two-terminal semiconductor devices including rectifiers, signal diodes, pin diodes, zener diodes, transient suppression diodes, as well as other types of diodes.

It is therefore intended that the foregoing detailed description be regarded as illustrative rather than limiting, and that it be understood that it is the following claims, including all equivalents, which are intended to define the scope of this invention.

I claim:

1. A surface mountable bipolar diode comprising:
   a first semiconductor element which defines a first outer face and a first inner face and comprises means for forming a first p-n junction therebetween;
   a second semiconductor element which defines a second outer face and a second inner face and comprises means for forming a second p-n junction
   first means for electrically interconnecting and mechanically securing the first and second inner faces together between the outer faces to form an integrated unit which defines a base extending between the outer faces, wherein the first and second p-n junctions are oriented with reverse polarity;
   first and second conductive surfaces mounted on the first and second outer faces such that the first and second p-n junctions are positioned between the first and second conductive surfaces and the conductive surfaces extend away from the base;
   said conductive surfaces positioned for surface mounting to respective mounting surfaces extending alongside the base.

2. The invention of claim 1 wherein the conductive surfaces are oriented parallel to each other and substantially transverse to the base.

3. The invention of claim 1 wherein the first means comprises a solder secured between the inner faces.

4. The invention of claim 1 wherein the conductive surfaces comprise respective metallized layers.

5. The invention of claim 2 wherein the base of the integrated unit rests on a mounting surface which defines first and second contacts, each oriented parallel to the base and in contact with a respective one of the conductive surfaces such that the conductive surfaces extend transversely away from the contacts, and wherein first and second fillets of a conductive securing agent are bonded between the contacts and the respective conductive surfaces.

6. A bipolar diode surface mounted between first and second contact surfaces, each oriented parallel to a mounting plane, comprising:
   a first semiconductor element comprising first and second semiconductor regions which define a first p-n junction therebetween and a first conductive surface on the first region;
   a second semiconductor element comprising third and fourth semiconductor regions which define a second p-n junction therebetween and a second conductive surface on the third region;
   first means for mechanically securing the first and second semiconductor elements together to form an integrated unit having a lower surface and at least first and second side surfaces, wherein the first and second conductive surfaces are positioned on respective opposed portions of the side surfaces, and wherein the first means comprises means for electrically interconnecting the second and fourth regions at a location spaced from the lower surface;
   said lower surface positioned to bridge the contact surfaces, with each of the conductive surfaces in contact with a respective one of the contact surfaces and angled with respect to the mounting plane;
   second means for electrically interconnecting and physically securing each of the conductive surfaces to the respective contact surface, said second means comprising a conductive material which moves across the conductive surfaces by capillary action when in a fluid state.

7. The invention of claim 6 wherein the conductive surfaces comprise respective metallized layers on the first and third regions.

8. The invention of claim 7 wherein the conductive surfaces are oriented parallel to one another and transverse to both the lower surface and the mounting plane.

9. The invention of claim 6 wherein each of the semiconducting elements forms a respective zener diode, and wherein the zener diodes are oriented back-to-back in the integrated unit.

10. The invention of claim 6 wherein each of the first and third regions defines a respective outer face, wherein the first and second conductive surfaces are positioned on the outer faces of the first and third regions, respectively, wherein the second and fourth regions are centered on the first and third regions, respectively, and wherein the first means comprises a conductive element secured between the second and fourth regions such that the two second and fourth regions are held in closely spaced, parallel relationship.

11. The invention of claim 10 wherein the outer faces are oriented parallel to one another.

12. The invention of claim 10 wherein the conductive element and the second and fourth regions are spaced from the lower surface to prevent the conductive material of the second means from contacting the conductive element and the second and fourth regions.

13. A surface mounted diode for mounting on a mounting surface which comprises a pair of spaced contacts, each oriented parallel to a mounting plane, said diode comprising:
- a semiconductor element which defines a base and first and second opposed faces extending away from the base, said semiconductor element comprising a p-n junction electrically interconnected between the opposed faces and spaced from the base;
- a first exposed conductive layer secured to the first opposed face; and
- an interconnecting element electrically interconnected with the second opposed face, said interconnecting element defining a second exposed conductive layer arranged generally parallel to the first exposed conductive layer such that the p-n junction is interposed between the two exposed conductive layers;
- each of said conductive layers defining a respective exposed surface, said base oriented parallel to the mounting plane such that each of the exposed surfaces of the conductive layers is in contact with a respective one of the spaced contacts and extends away from the mounting plane; and
- two masses of a conductive securing agent, each secured to both a respective one of the contacts and the exposed surface of the associated conductive layer to form a fillet, said securing agent selected to move onto the exposed surfaces by capillary action when in a fluid state.

14. The invention of claim 13 wherein the interconnecting element comprises an additional p-n junction of opposite polarity to the p-n junction of the semiconductor element.

15. The invention of claim 13 wherein the interconnecting element corresponds in shape to the semiconductor element.

16. The invention of claim 13 wherein the interconnecting element has an electrical resistance which is substantially independent of polarity.

17. The invention of claim 13 wherein the exposed surfaces are oriented perpendicular to the base and the mounting plane.

18. The invention of claim 17 wherein the p-n junction defines a junction plane oriented parallel to the exposed surfaces.

19. The invention of claim 13 wherein the first exposed conductive layer comprises a metallized layer which defines the respective exposed surface.

20. A surface mounted diode for mounting on a mounting surface which comprises a pair of spacec contacts, each oriented parallel to a mounting plane, said diode comprising:
- a semiconductor element which defines a base and first and second opposed faces extending away from the base, said semi-codnuctor element comprising a p-n junction electrically interconnected between the opposed faces and spaced from the base;
- a first exposed conductive layer secured to the first opposed face; and
- an interconnecting element electrically interconnected with the second opposed face, said interconnecting element defining a second exposed conductive layer arranged generally parallel to the first exposed conductive layer such that the p-n junction is interposed between the two exposed conductive layers, said interconnecting element comprising an additional p-n junction of opposite polarity to the p-n junction of the semiconductor element;
- each of said conductive layers defining a respective exposed surface, said base oriented parallel to the mounting plane such that each of the exposed surfaces of the conductive layers is in contact with a respective one of the spaced contacts and extends away from the mounting plane; and
- two masses of a conductive securing agent, each secured to both a respective one of the contacts and the exposed surface of the associated conductive layer to form a fillet, said securing agent selected to move onto the exposed surfaces by capillary action when in a fluid state.

21. A surface mounted diode for mounting on a mounting surface which comprises a pair of spaced contacts, each oriented parallel to a mounting plane, said diode comprising:
- a semiconductor element which defines a base and first and second opposed faces extending away from the base, said semiconductor element comprising a p-n junction electrically interconnected between the opposed
- a first exposed conductive layer secured to the first opposed face; and
- an interconnecting element electrically interconnected with the second opposed face, said interconnecting element defining a second exposed conductive layer arranged generally parallel to the first exposed conductive layer such that the p-n junction is interposed between the two exposed conductive layers, said interconnecting element corresponding in shape to the semiconductor element;
- each of said conductive layers defining a respective exposed surface, said base oriented parallel to the mounting plane such that each of the exposed surfaces of the conductive layers is in contact with a respective one of the spaced contacts and extends away from the mounting plane; and
- two masses of a conductive securing agent, each secured to both a respective one of the contacts and the exposed surface of the associated conductive layer to form a fillet, said securing agent selected to move onto the exposed surfaces by capillary action when in a fluid state.

22. The invention of claim 21 wherein the interconnecting element has an electrical resistance which is substantially independent of polarity.

23. A surface mountable bipolar diode comprising:
- first and second semiconductor elements, each element defining a respective first face and a respective second face, wherein the first and second faces of each element are oriented parallel to one another;
- first and second metallized layers, each positioned on a respective one of the second faces of said first and second elements;

first and second p-n junctions, said first p-n junction being positioned and electrically interconnected between the first and second faces of said first semiconductor element, and said second p-n junction being positioned and electrically interconnected between the first and second faces of said second semiconductor element; and means for mechanically securing and electrically interconnecting the first faces of said first and second semiconductor elements together such that second faces of said first and second elements are held in spaced parallel relationship with the first and second p-n junctions oriented in reverse polarity.

24. The invention of claim 23 wherein the securing and interconnecting means comprises a solder.

25. The invention of claim 23 wherein each of the semiconductor elements defines a respective lower face adapted to rest on a mounting surface, and wherein the metallized layers are oriented substantially transverse to the respective lower faces.

26. The invention of claim 25 wherein the means for securing and interconnecting the p-n junctions are spaced from the lower faces.

* * * * *

UNITED STATES PATENT OFFICE
CERTIFICATE OF CORRECTION

Patent No. 4,709,253　　　　　　　　　Dated November 24, 1987

Inventor(s) Cecil K. Walters

It is certified that error appears in the above-identified patent and that said Letters Patent are hereby corrected as shown below:

Claim 1, column 7, line 53 after "junction" add -- therebetween; --.
　　　Claim 20, column 9, line 60, change "spacec" to -- spaced --.
　　　Claim 20, column 9, line 65, change "semicodnuctor" to -- semiconductor --.

Signed and Sealed this

Twentieth Day of September, 1988

Attest:

DONALD J. QUIGG

Attesting Officer　　　　Commissioner of Patents and Trademarks